INVENTOR
LYNN J. BRADY
BY John J. Gaydos
ATTORNEY

INVENTOR
LYNN J. BRADY
BY John J. Gaydos
ATTORNEY

United States Patent Office 3,346,774

Patented Oct. 10, 1967

3,346,774
ELECTRICAL COMPONENT SUBSTRATE WITH CAVITIES FOR ANCHORING LEAD WIRES THEREIN

Lynn J. Brady, Edwardsburg, Mich., assignor to CTS Corporation, Elkhart, Ind., a corporation of Indiana Filed July 30, 1965, Ser. No. 475,997
17 Claims. (Cl. 317—101)

ABSTRACT OF THE DISCLOSURE

A ceramic substrate having a flat surface for supporting an electrical device and a sufficient thickness enabling cavities to be provided in the substrate and communicating at least with a front surface. Lead wires are anchored in the cavities and each of the cavities is of a size insufficient to receive freely the lead wires, the lead wires being forced into the opening deforming the lead wire and fixedly securing the lead wire directly to the substrate. Recesses can be provided in the front surface of the substrate for the cavities and preferably a pair of stand-offs project forwardly of the substrate for spacing the front surface of the substrate from a mounting surface. In another embodiment means are formed on the front surface for increasing the air gap between solder deposits of adjacently mounted substrates, the solder deposits electrically connecting the lead wires to the electrical device.

The present invention relates to electrical components, and, more particularly, to an electrical component of the modular type containing a supporting substrate and to an improved substrate, and the present invention is a continuation-in-part of Brady et al. patent application Ser. No. 379,684, filed July 1, 1964, now Patent No. 3,280,378.

With the advent of miniature electrical devices, the trend toward assembling a plurality of electrical devices in a single modular package is rapidly increasing. Obviously, many advantages are obtained by prepackaging the electrical devices. These small packages, commonly referred to as circuit modules, because of their small size, are ideal for use in electronic equipment such as computers and the like which employ thousands of identical or similar circuit modules.

In order that the terminology used in the specification will be fully understood, certain terms are being defined below:

Electrical device—includes both active and passive devices.

Active device—denotes an electrical circuit element, e.g., a diode or a transistor, capable of performing amplifying or control functions.

Passive device—denotes an electrical circuit element not capable of performing amplifying or control functions, e.g., a resistor or a capacitor.

Circuit module—denotes an electrical component or packaged circuit containing a plurality of electrical devices of a size that at least 200,000 electrical devices supported by a plurality of circuit modules can be packaged in one cubic foot.

In general, each of the circuit modules resembles a box or packaged circuit having a plurality of lead wires or terminal pins extending outwardly therefrom for connecting the circuit module into a circuit of the electronic equipment. Heretofore, the lead wires have been, for example, molded into the material forming the outer dimensions of the box. In other words, some circuit modules comprise a plurality of electrical devices supported by a mounting board of vulcanized fiber or the like having a plurality of lead wires extending outwardly from the mounting board. After the electrical devices are connected to the lead wires, the mounting board supporting the electrical device is encapsulated in a suitable electrically insulative material such as plastic. When ceramic dielectric bodies are employed as the substrate for supporting the electrical devices, the ends of the lead wires are generally soldered or welded to conductive paths bonded and supported by the same surface of the body supporting the electrical devices. Although satisfactory for certain type circuit modules, the soldered or welded connection frequently is twisted or loosened at the junction during handling and consequently the resistance of the connection is increased or else the lead wire and solder completely separates from the conductive path forming an open circuit. If the pull force of the soldered or welded connection is increased, then the bond between the conductive path and the ceramic dielectric body limits the maximum pull force of the connection. It would, therefore, be desirable to provide a circuit module having improved electrical connections to the electrical devices.

Other circuit modules comprising a substrate of ceramic dielectric material provided with through bores having disposed therein headed lead wires, i.e., nail-shaped lead wires, or terminal pins are currently used with circuit modules for certain electronic equipment. Although the circuit modules with headed lead wires are satisfactory, caution must be exercised to avoid damage to the circuit modules when the lead wires are being inserted into the connectors of a mounting panel. Moreover, by inserting lead wires into the bores which extend completely through the substrate and communicate with the major surface thereof, i.e., the surface supporting the electrical devices, the size of the substrate is increased since the major surface thereof supporting the electrical devices must be sufficiently large to provide adequate area or space for the through bores and the heads of the lead wires as well as for the electrical devices. It would, therefore, be desirable to provide an improved circuit module having a substrate of ceramic dielectric material with improved anchoring means for the lead wires or terminal pins.

As the size of the circuit modules decreases, additional problems are always encountered such as dissipating the heat generated by the electrical devices and providing good electrical connections between the lead wires and the electrical devices. It would, therefore, also be desirable to provide a circuit module having a supporting surface or substrate substantially smaller than heretofore available with a good heat sink for dissipating the generated heat.

High density component packaging not only requires small individual packages of circuit modules, each module containing a plurality of electrical devices, but also that the circuit modules be mounted closely to each other to such a degree that the sides of adjacent modules abut against and make contact with each other. The electrical devices are deposited on one or top surface of a circuit module and, by maintaining the other side free of electrical devices and mounting the modules in stacked relationship with the top surface facing one direction, shorting between modules does not occur if care is employed during manufacture. However, since the lead wires, metal deposits and pads of conductive material are secured to the front surface or side normal to the top surface of a circuit module, it is possible that a portion of a metal deposit or pad of conductive material is deposited onto the bottom surface of the module. Moreover, the metal deposits usually extend slightly beyond the major plane of the bottom surface of a module and form a slight protuberance on the bottom thereof. Although the modules are coated with an electrically nonconductive coating to insulate the entire circuit module, the pressure applied between abutting sides of adjacent modules when the modules are mounted next to each other causes some of the electrical devices of one circuit module to be shorted to the electrical devices of an adjacent circuit module. Such shorting results from insulation breakdown between adjacent modules when a voltage is applied to the circuit modules. By applying a thicker coat or more layers of the electrically nonconductive coating, the voltage breakdown is improved. This, however, increases the manufacturing cost of the modules. It would, therefore, be desirable to provide an improved substrate of ceramic dielectric material for a circuit module capable of withstanding a higher voltage breakdown test than heretofore possible when the modules are in stacked relationship.

Accordingly, it is an object of the present invention to provide a new and improved circuit module comprising a plurality of electrical devices supported on a substrate of ceramic dielectric material or on a supporting surface having the various desirable features set forth above.

Another object of the present invention is to provide an improved circuit module having a plurality of lead wire ends embedded in a substrate, the unsupported ends extending outwardly from one or both surfaces normal to the major surface supporting the electrical devices.

An additional object of the present invention is to provide a circuit module with lead wires having end portions thereof mechanically anchored in a ceramic dielectric substrate and center portions thereof electrically connected to the conductive paths with metal deposits.

A further object of the present invention is to provide a circuit module with a plurality of lead wires embedded in a side of a substrate and lying in a plane spaced from the major surface of the substrate supporting the electrical devices and the conductive paths for maintaining the surface area at a minimum.

A still further object of the present invention is to provide a circuit module comprising a substrate of ceramic dielectric material having a top surface for supporting the electrical devices and having a sufficient thickness for anchoring the lead wires of the circuit module in the side of the substrate.

Yet another object of the present invention is to provide an improved substrate for a circuit module permitting an increase in air gap or in the voltage breakdown between adjacently mounted modules.

An additional objects of the present invention is to provide for a circuit module an improved substrate of ceramic dielectric material having a discontinuity on the front surface thereof for increasing the air gap between corresponding metal deposits of adjacently mounted substrates.

Further objects and advantages of the present invention will become apparent as the following description proceeds, and the features of novelty characterizing the invention will be pointed out with particularity in the claims annexed to and forming a part of this specification.

Briefly, the invention in one specific embodiment thereof is concerned with an improved electrical component of the modular type comprising a substrate of ceramic dielectric material having a plurality of electrical devices supported on a first or major surface thereof and a plurality of lead wires anchored in the substrate and extending outwardly from a second surface normal to the first surface supporting the electrical devices. An end portion of each of the lead wires is fixedly secured or anchored in a cavity communicating with the second surface of the substrate. A pad of conductive material extends completely around each of the openings of the cavities, and the pads of conductive material are electrically connected to the electrical devices supported by the first surface with electrically conductive paths. The center portion of each of the lead wires is electrically connected to the pads of conductive material extending around the openings of the cavities by a metal deposit, for example, solder. Preferably each of the metal deposits is also bonded to a portion of the conductive path adjacent to the pad of conductive material. The metal deposits, therefore, not only mechanically improve the mechanical connection between the substrate and the lead wire, but also assure a good electrical connection between the pads of conductive material and the conductive paths.

In other specific embodiments of the invention when an increased air gap or a higher voltage breakdown between adjacently mounted circuit modules is preferred, the substrate is provided with means, e.g., a discontinuity, for increasing the air gap between circuits of adjacently mounted circuit modules.

For a better understanding of the present invention, reference may be had to the accompanying drawings wherein the same reference numerals have been applied to like parts and wherein.

FIGURES *7a*, *7b* and *7c* through *10a*, *10b* and *10c* are modified forms of the present invention showing substrates for improving the air gap or voltage breakdown between electrical components in stacked relationship.

Figures 11, 12:
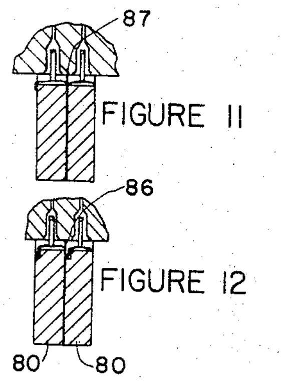
Figure 13:
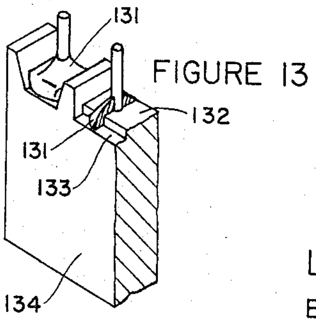

FIGURE 11 is a sectional view of a plurality of electrical components shown in FIGURES 1–6 in stacked relationship;

FIGURE 12 is a sectional view of a plurality of electrical components employing the substrate design shown in FIGURES *7a*, *7b* and *7c*; and FIGURE 13 is an enlarged fragmentary isometric view of a portion of an electrical component of FIGURE 12.

Referring now to the drawings, there is illustrated an electrical component of the circuit module type, generally indicated at 10, comprising a plurality of electrical devices 11 carried by a substrate 12 preferably of a ceramic dielectric material.

Considering first the substrate 12, it is molded of a high temperature heat-resistant material such as alumina or steatite. Inasmuch as the electrical component is pushed or inserted into a not shown mounting panel containing a plurality of connectors, it is preferable that the substrate be provided with a pair of suitable gripping surfaces namely the top surface 13 and the bottom surface 14 of the substrate 12. As illustrated in the drawings, the top or major surface 13 of the substrate 12 is parallel to the bottom surface 14, a pair of end surfaces 15 and 16 are parallel to each other, and the rear surface 17 is parallel to the front surface 18. For ease of gripping and handling, the distance between the top surface 13 and the bottom surface 14 is preferably substantially less than the distance between the rear surface 17 and the front surface 18. The electrical components 10 currently being manufactured are .100 inch thick and .35 inch wide. The length is a minimum of .25 inch for a component having two lead wires and increases .125 inch or .150 inch for each additional lead wire. Moreover, such construction is also preferable whenever the electrical component 10 is to occupy a minimum area of the mounting panel.

For the purpose of spacing the front surface 18 of the substrate 12 from the mounting panel, the substrate is provided with a pair of forwardly projecting stand-offs 19 and 20. In a preferred form of the invention the stand-offs 19 and 20 are an extension of the end surfaces 15 and 16. It is to be understood, however, that the feet may be spaced inwardly of the end surfaces along the front surface 18 for spacing the front surface 18 of the substrate 12 from the mounting panel. In order to connect the electrical devices 11 supported on the top surface 13 of the substrate 12 to the connectors provided in the mounting panel, a plurality of lead wires 22 are anchored in cavities 23 provided with openings 24 communicating with the front surface 18 of the substrate. Each of the cavities 23 receiving the end of one of the lead wires 22 is preferably located in a recess 25, i.e., a ridge 26 is provided between adjacent cavities 23 in the front surface 18 of the substrate 12.

Figure 6:
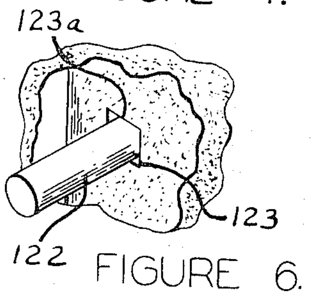
FIGURE 6 is an enlarged fragmentary isometric view of a modified form of the present invention showing a lead wire anchored in a square cross section cavity before applying the metal deposit thereto.
Figure 7A:
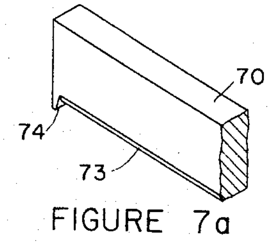
Figure 7B:
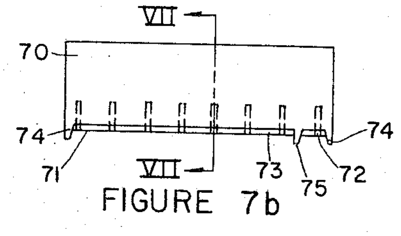
Figure 7C:
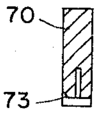

In one form of the invention, the cavities 23 are tapered (see FIGURE 4) to facilitate insertion of the ends of the lead wires 22 thereinto. Cylindrical cavities are also satisfactory since standard inserts can be employed for molding the substrates. Square cross section cavities 123 as shown in FIGURE 6 are, however, preferred since circular cross section lead wires 122 are readily available and, when such lead wires 122 are inserted into the square cross section cavities 123, the edges of the lead wires bite into the sides **123*a* of the cavities for anchoring the ends of the lead wires 122 therein. Regardless of the configuration of the cavities 23, the thickness of the substrate must be at least twice the diameter of one of the lead wires, therefore, sufficient to accommodate the cavities extending partially into the side of the substrate and the lead wires disposed in the cavities. The increased thickness of the substrate 12** also increases the heat sink of the circuit module.

Figures 1, 2:
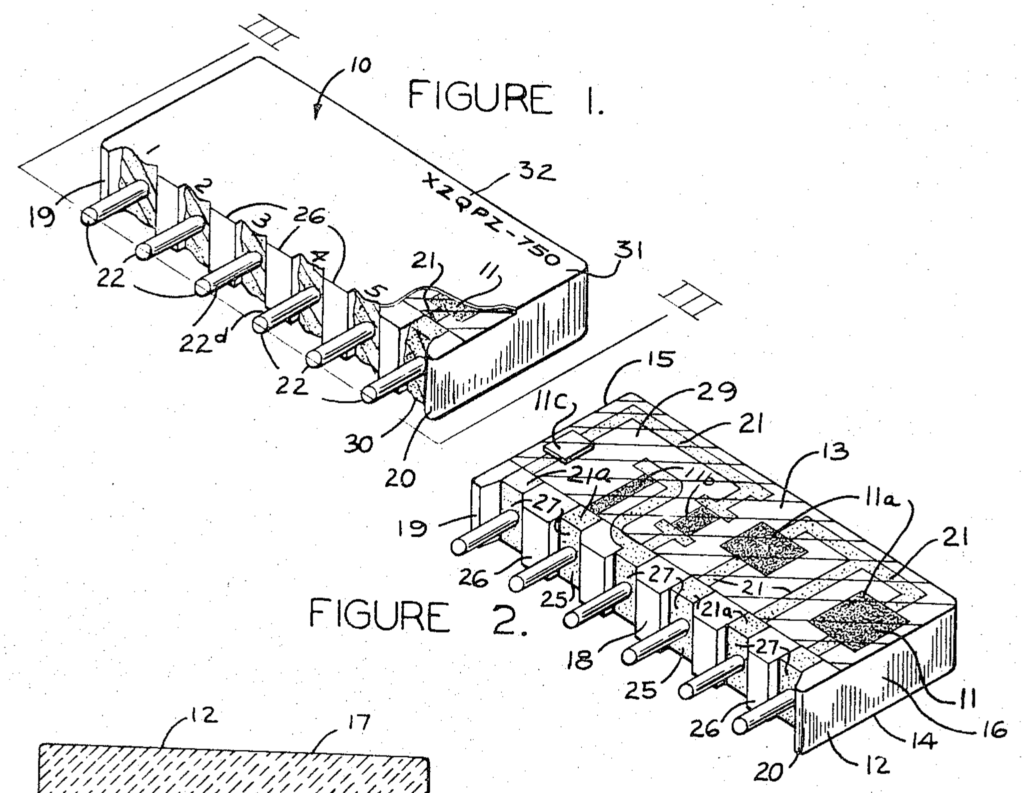
FIGURE 1 is an isometric view of an electrical component built in accord with the present invention with a portion of the coating removed.
FIGURE 2 is an isometric view of the electrical component shown in FIGURE 1 of the drawings before the soldering and encapsulating step.
Figure 3:
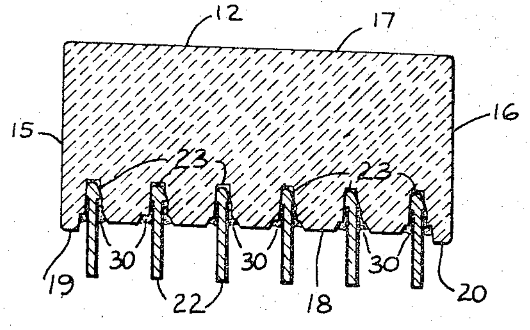
FIGURE 3 is a cross section taken along line III—III of FIGURE 1.

In producing the electrical component 10 shown in FIGURE 1, of the drawings, generally the first step is to polish the top or major surface 13 of the substrate 12 in a manner well known in the art if the surface is too rough. A network of conductive paths 21 is then deposited, e.g., by a conventional screening process, upon the top surface 13 of the substrate 12. The conductive paths 21 are formed with a good electrically conductive paint, i.e., a composition containing at least one of the nonoxidizing noble metals, dispersed in finely divided form in a vitreous matrix. After the conductive paths 21 have been screened onto the top surface 13 of the substrate 12, the substrate 12 with the conductive paths 21 screened thereon is fired above the fusion temperature of the vitreous matrix, but below that of the metal to drive off the organic vehicles and fuse the vitreous matrix. As best seen in FIGURE 2 of the drawings, some of the conductive paths 21 extend along the top surface of the substrate to the edge of the recesses 25 provided in the front surface 18 of the substrate 12.

The next step comprises the depositing of pads 27 of conductive material onto the inner walls of the recesses 25 and simultaneously the depositing of layers 28 (see FIGURE 4) of conductive material onto the inner walls of the cavities 23. As will be pointed out hereinafter, in a preferred form of the invention, the layers 28 of the conductive material deposited around the edge portions of the cavities 23 and around the openings of the cavities 23 improve the mechanical and electrical connection between the lead wires 22 and the pads 27. The pads 27 of conductive meterial also overlap the edges of the layers 28 and the end portions **21*a* of the conductive paths 21 disposed on the top surface 13 of the substrate 12. Obviously the pads 27 and the layers 28 of conductive material could be deposited in the recesses 25 and edge portions of the cavities 23 prior to or simultaneously with the step of depositing the conductive paths 21 on the top surface 13 of the substrate or any other suitable sequence so long as electrical continuity between the paths 21, the conductive pads 27, and the layers 28** is obtained. The substrate is preferably fired after each step to bond the material to the substrate.

The electrical devices 11 such as a thin film capacitor **11*a* and thin film resistors 11*b* are deposited on the top surface 13 of the substrate 12 in a suitable manner such as by screening or painting preferably after the paths 21, pads 27 and layers 28 of conductive material have been fired, the edges of the conductive paths 21 being in overlapping relationship with the electrical devices. Inasmuch as the manner of making the electrical devices 11 is not essential to an understanding of the present invention, further details are not included herein. A thorough disclosure of the composition and the method of making the capacitors 11*a* is included in Boykin patent application Ser. No. 283,729 filed May 28, 1963, now abandoned, and one of the compositions of the thin film resistors 11*b* is included in Faber, Sr., et al. patent application Ser. No. 322,702, filed Nov. 12, 1963, now Patent No. 3,304,199. An electrical device such as an active device 11*c* may also be attached to the top surface 13 of the substrate 12 in a suitable manner well known in the art. After all of the electrical devices 11 are supported by the top surface of the substrate, the top surface is coated with a suitable material 29 such as a layer of glass or organic coating material (see FIGURE 2) to protect the electrical devices 11** from atmospheric, and other environmental, conditions.

Figure 4:
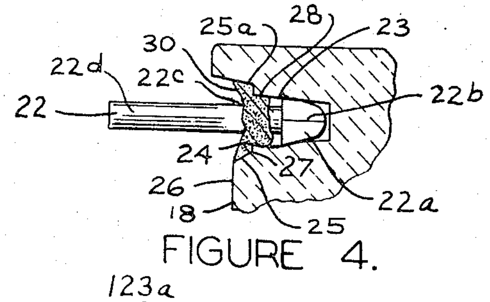
FIGURE 4 is an enlarged fragmentary section of the electrical component shown in FIGURE 3 of the drawing.
Figure 5:
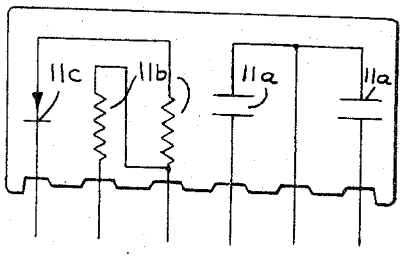
FIGURE 5 is a schematic circuit of the electrical component.

In accord with one form of the present invention, the lead wires 22 preferably tinned are fixedly secured or anchored in the caviteis 23 communicating with the front surface 18 of the substrate 12. The end portions **22*a* of each of the lead wires 22 are provided with lateral projections engaging the side wall of each of the cavities 23, for anchoring the lead wires to the substrate 12, and, as best shown in FIGURE 4 of the drawings, the end portions 22*a* of the lead wire 22 are formed with a plurality of fins or barbs 22*b* similar to arrow heads. The barbs 22*b* of the lead wires 22 engage the side walls of the cavities 23 and the lead wires 22 are forcefully inserted into the cavities for mechanically securing and anchoring the lead wires 22 in the substrate. It is to be understood that the lead wires 22 can extend outwardly from the rear surface 17 as well as the front surface 18**, and the free ends of the lead wires can be bent, for example, 90 degrees, or as desired.

It will be appreciated that after the lead wires 22 are fixedly secured in the cavities 23 a good electrical connection must be made between the lead wires 22 and the pads 27 of conductive material surrounding the openings 24 of the cavities 23 for connecting the lead wires 22 to the electrical devices 11. To this end and as best illustrated in FIGURE 4 of the drawings, a metal deposit 30 is adhered to each of the center portions **22*c* of the leads wires 22 and to the pads 27 of conductive material by suitable means such as by dipping the substrate into molten metal, e.g., solder. The metal deposits 30 adhere to the pads 27 of the conductive material surrounding the center portion 22*c* of the lead wires 22 and to the end portions 21*a* of the conductive paths 21 not coated with the material 29 deposited on the top surface 13 of the substrate 12 and cover the junctions between the end portions of the conductive paths 21 and the pads 27 of conductive material. The portions of the metal deposits 30 overlapping the junctions prevent open circuits or high resistance paths formed at the edges of the top surface 13 and the rear walls of the recesses 25. By depositing layers 28 of conductive material around the edge portions of the cavities 23, the metal deposits 30 are attracted partially into the cavities 23 and, upon cooling, the portions of the metal deposits in the cavities further reinforce and mechanically secure the lead wires 22 to the substrate 12. By providing the openings 24 of the cavities 23 in the recesses 25 and by depositing the pads 27 on a portion of the sides 25*a* of the recesses 25, the configuration of each of the meal deposits is controlled to a certain extent and build-up of the metal deposits along the outer portions 22***d* of the lead wires 22 which are tinned is limited, and accordingly, the metal deposits 30 do not interfere with the not shown connectors of the mōunting panel when the free ends of the lead wires 22 are inserted thereinto. Otherwise, it would be necessary to increase the length of the stand-offs 19 and 20 for increasing the space between the front surface 18 of the substrate 12 and the mounting panel, thereby reducing the number of electrical devices that can be packaged in one cubic foot.

After the metal deposits 30 have cooled, the circuitry of the electrical component 10 is completed, and the component 10 can be readily inserted into the connectors of the mounting panel. Due to the fact that the lead wires are mechanically secured by anchoring of the end portions 22*a* in the cavities 23 as well as mechanically secured to the front surface of the substrate and the front portion of the cavities 23 by the metal deposits 30, the electrical component 10 can be inserted and removed from the mounting panel without danger of the lead wires being removed from or loosened in the substrate 12.

For the purpose of further protecting the electrical devices 11 supported by the top surface 13 of the substrate 12, a step of applying an electrically nonconductive coating 31 around the substrate can be added to the method of making circuit modules of the present invention to encapsulate the entire circuit module excluding the free end portions 22*d* of the lead wires 22 projecting forwardly from the front surface 18 thereof.

The electrical components are preferably employed in equipment where high density packaging of components is desirable. The electrical components are, therefore, frequently mounted in stacked relationship (see FIGURES 11 and 12) causing the components to contact each other. Since the components have pads of conductive material and metal deposits adhered to the front surface thereof, it is necessary that an adequate cover coat be applied to the components to prevent the pads and the metal deposits of adjacently mounted componets from becoming shorted to each other. Preferably an extremely thick cover coat of several layers of insulating material is applied to the components to assure that any metal deposit overhang, i.e., a metal deposit depending from the bottom surface thereof does not penetrate the cover coat and short against a conductive path or metal deposit on the front surface of an adjacently mounted component when the components are in stacked relationship. Moreover, the cover coat should not break down when subjected to a test voltage.

In other preferred embodiments of the invention as shown in FIGURES 7*a* to 10*a*, a thick cover coat is not required for insulating a metal deposit overhang from a corresponding metal deposit of an adjacently mounted electrical component. More specifically, FIGURES 7*a*, 7*b* and 7*c* respectively show a fragmentary isometric view, a bottom plan view, and a cross section taken along line VII—VII of FIGURE 7*b* of a substrate 70 employed in making an electrical component. The substrate 70 is substantially the same as the substrate 12 of FIGURES 1–5 of the drawings except that the front surface 71 is flush instead of being provided with recesses 25 and ridges 246. Careful control of the width of the pads 27 of conductive material and the application of metal deposits during the manufacturing process eliminates the need for the ridges 26. The cavities 72 are of noncircular cross section, for example, as shown in FIGURE 6 of the drawings, for receiving circuit lead wires. Cavities of circular cross section can, however, be used. For the purpose of avoiding shorting of corresponding metal deposits of adjacently mounted electrical components or breakdown of a thin cover coat, the substrates are provided with a discontinuity, i.e., an indentation, inclination or shoulder on the front surface, e.g., a beveled edge 73 intermediate the standoffs 74, the beveled edge 73 being interrupted by an indexing means 75 orienting the substrate for mounting since, after the cover coat is applied to the substrate, it is extremely difficult, when mounting the component, to recognize the top surface thereof.

Figure 8A:
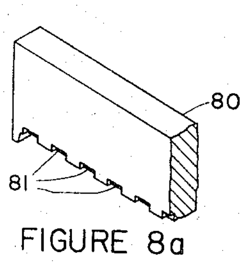
Figure 8B:
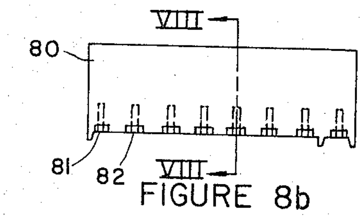
Figure 8C:
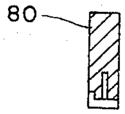

Although the substrate 80 of FIGURES 8*a*, 8*b* and 8*c* is provided with an interrupted discontinuity, more specifically a plurality of notches 81 associated with a pluraliyt of cavities 82, the effect of the notches 81 is the same as the beveled edge 73 of the substrate 70. This is best understood by referring to FIGURE 12 which shows a plurality of electrical components produced from substrates 80 and the increased air gap 86 that results between corresponding metal depsits of adjacently mounted components. It is obvious that an elongated beveled edge or notch is just a satisfactory as a plurality of interrupted notches 81 or interrupted beveled edges so long as the means, i.e., the discontinuity or discontinuities, associated with the cavities increase the air gap and the voltage breakdown between adjacently mounted components.

Figure 9A:
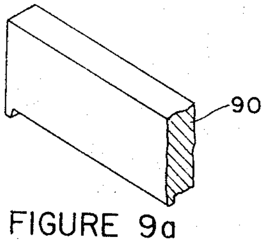
Figure 9B:
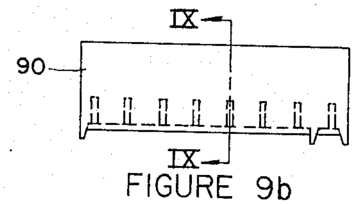
Figure 9C:
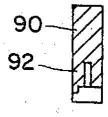
Figure 10A:
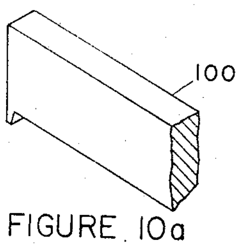
Figure 10B:
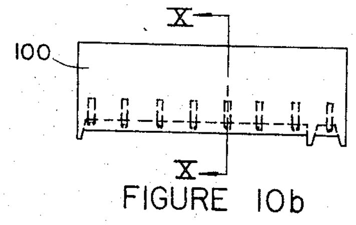
Figure 10C:
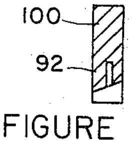

Additional embodiments of the present invention are shown in FIGURES 9*a* and 10*a* of the drawings. The substrates 90 and 100 are of a construction that any metal deposit overhang extending beyond the bottom surfaces 92 and 102 is spaced from the metal deposit on the front and top surfaces of an adjacently mounted component. It is not necessary that the discontinuity be formed at the bottom portion of the front surface as in FIGURES 7*a* and 8*a* but can be in the form of a shoulder, a V-slot or U-slot formed in the lower portion of the front surface so long as the discontinuity functions as a metal trap and increases the air gap between corresponding metal deposits of adjacently mounted substrates.

FIGURE 11 is a cross section of a pair of electrical components in stacked relationship employing a substrate shown in FIGURES 1–6 of the drawings wherein the metal deposits of adjacently mounted electrical components can become shorted to each other at 87 unless the insulation therebetween is of sufficient thickness. By employing a discontinuity such as a beveled edge, notch, shoulder or the like, the possibility of having corresponding metal deposits of adjacently mounted electrical components become shorted or having the thin cover coat break down under test voltage is eliminated. FIGURE 13 shows the metal deposits 131 adhered to the front surface 132 and terminating in a metal trap 133 short of the bottom surface 134 formed by the discontinuity on the front surface thereby eliminating shorting between adjacently mounted electrical components. For the purpose of identifying the circuit modules and the lead wires, a code number 32 can be stamped on the coating 31 of the electrical component 10 distinguishing the electrical component 10 from the other components and numbers can be stamped adjacent to the lead wires 22. Suitable indexing means can be provided in one of the ridges 26 of the substrate if necessary for orientation of the substrate during assembly.

From the above description it will be apparent that a very simple and structurally strong electrical component 10 and improved substrate therefor has been provided. In view of the above discussion, the steps involved in making the electrical components of the present invention will undoubtedly be understood and no further discussion is included herewith.

While there has been illustrated and described what is at present considered to be a preferred embodiment of the present invention, and several modifications thereof, it will be appreciated that numerous changes and modifications are likely to occur to those skilled in the art, and it is intended in the appended claims to cover all those changes and modifications which fall within the true spirit and scope of the present invention.

What is claimed as new and desired to be secured by Letters Patent of the United States is:

1. A high-heat resistant substrate of ceramic dielectric material for an electrical component adapted to support a plurality of electrical devices comprising a flat top surface for supporting the electrical devices, a flat bottom surface parallel to the top surface, a pair of end surfaces in spaced relationship, a rear surface and a front surface, the distance between the top surface and the bottom surface being substantially less than the distance between the rear surface and the front surface, a plurality of spaced recesses arranged along the front surface of the substrate, each of the recesses being provided with an inner wall substantially parallel to the front surface of the substrate, and a cavity communicating with the inner wall of each of the recesses for receiving a lead wire, the cavity being of a size insufficient to receive freely an end portion of the lead wire, the end portion being forced into the cavity to deform the lead wire and fixedly secure the lead wire directly to the substrate.

2. The high-heat resistant substrate of claim 1, wherein a pair of stand-offs are integral with the substrate and project forwardly from the front surface thereof for spacing the front surface from a mounting surface.

3. A high-heat resistant substrate of ceramic dielectric material for an electrical component adapted to support a plurality of electrical devices comprising a flat top surface for supporting the electrical devices, a bottom surface spaced from the top surface, a pair of end surfaces in spaced relationship, a rear surface and a front surface, the distance between the top surface and the bottom surface being substantially less than the distance between the rear surface and the front surface, a plurality of cavities communicating with the front surface of the substrate, and a pair of stand-offs integral with the substrate projecting forwardly from the front surface thereof for spacing the front surface from a mounting surface.

4. A high-heat resistant substrate of ceramic dielectric material for an electrical component adapted to support a plurality of electrical devices comprising a flat top surface for supporting the electrical devices, a flat bottom surface parallel to the top surface, a pair of end surfaces in spaced relationship, a rear surface and a front surface, a plurality of cavities communicating with the front surface for receiving lead wires, each of the cavities being of a size insufficient to receive freely an end portion of the lead wire, the end portion being forced into the cavity to deform the lead wire and fixedly secure the lead wire directly to the substrate, and a pair of stand-offs integral with the substrate projecting outwardly from the front surface for spacing the front surface from a mounting panel.

5. A high-heat resistant substrate of ceramic dielectric material for an electrical component adapted to support a plurality of electrical devices comprising a flat top surface, a bottom surface in spaced relationship to the top surface, a front surface normal to the top surface, the distance between the top surface and the bottom surface being substantially less than the distance between the rear surface and the front surface, and a plurality of cavities having their major axes parallel to the top surface for receiving lead wires, each of the cavities being of a size insufficient to receive freely an end portion of the lead wire, the end portion being forced into the cavity to deform the lead wire and fixedly secure the lead wire directly to the substrate, each of the cavities being provided with an opening communicating with the front surface.

6. The high-heat resistant substrate of claim 5, wherein the distance between the top surface and the bottom surface of the substrate is at least twice the distance of the opening of each of the cavities.

7. The high-heat resistant substrate of claim 5. wherein the cross section of each of the cavities is noncircular.

8. A high-heat resistant substrate of ceramic dielectric material for an electrical component adapted to support a plurality of electrical devices comprising a flat top surface for supporting the electrical devices, a bottom surface parallel to the top surface, a front surface for receiving metal deposits, a plurality of cavities communicating with the front surface, and means formed on the front surface for increasing the air gap between corresponding metal deposits of adjacently mounted substrates.

9. The high-heat resistant substrate of claim 8, wherein the means comprises a discontinuity extending along the lower portion of the front surface.

10. The high-heat resistant substrate of claim 8, wherein the front surface of the substrate forms an obtuse angle with the top surface.

11. The high-heat resistant substrate of claim 8, wherein the means comprises a shoulder extending along the lower portion of the front surface.

12. The high-heat resistant substrate of claim 8, wherein the means comprises a plurality of individual discontinuities, and each discontinuity is associated with one of the cavities.

13. The high-heat resistant substrate of claim 12, wherein the discontinuities comprise a plurality of notches associated with the cavities.

14. A high-heat resistant substrate of ceramic dielectric material for an electrical component, said substrate having a top surface for supporting a plurality of electrical devices, a bottom surface in spaced relationship to the top surface, a front surface for receiving metal deposits, a plurality of cavities communicating with the front surface, the distance between the top surface and the bottom surface being at least twice the distance of the cross section of each of the cavities, and means formed on the front surface for increasing the air gap between corresponding metal deposits of adjacently mounted substrates.

15. The high-heat resistant substrate of claim 14, wherein a pair of stand-offs are integral with the substrates and project forwardly from the front surface thereof for spacing the front surface from a mounting surface.

16. A high-heat resistant substrate of ceramic dielectric material for an electrical component adapted to support a plurality of electrical devices comprising a flat top surface for supporting the electrical devices, a bottom surface parallel to the top surface, a front surface, a plurality of cavities commnuicating with the front surface, and a beveled edge formed on the front surface for increasing the air gap between front surfaces of adjacently mounted substrates.

17. A high-heat resistant substrate of ceramic dielectric material for an electrical component adapted to support a plurality of electrical devices comprsiing a flat top surface for supporting the electrical devices, a bottom surface parallel to the top surface, a front surface, a plurality of cavities communicating with the front surface, and a notch formed on the front surface for increasing the air gap between front surfaces of adjacently mounted substrates.

References Cited

UNITED STATES PATENTS

| | | | |
|---|---|---|---|
| 2,663,830 | 12/1933 | Oliver | 317—101 |
| 2,989,665 | 6/1961 | Khouri. | |
| 3,002,481 | 10/1961 | Hutters. | |
| 3,029,495 | 4/1962 | Doctor. | |
| 3,052,822 | 9/1962 | Kilby. | |
| 3,105,868 | 10/1963 | Feigin et al. | |
| 3,122,679 | 2/1964 | Kislan et al. | |
| 3,134,049 | 5/1964 | Kilby. | |
| 3,142,000 | 7/1964 | Bernstein. | |
| 3,177,406 | 4/1965 | Bernstein. | |
| 3,179,854 | 4/1965 | Luedicke et al. | |
| 3,185,952 | 5/1965 | Potter et al. | |

ROBERT K. SCHAEFER, *Primary Examiner.*

J. R. SCOTT, *Assistant Examiner.*